United States Patent
Tenma et al.

(10) Patent No.: US 6,636,774 B2
(45) Date of Patent: Oct. 21, 2003

(54) CAD SUPPORTING APPARATUS, AND CAD SUPPORTING PROGRAM STORAGE MEDIUM

(75) Inventors: Tsukasa Tenma, Kawasaki (JP); Yuichi Arita, Kawasaki (JP); Akira Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 191 days.

(21) Appl. No.: 09/814,757

(22) Filed: Mar. 23, 2001

(65) Prior Publication Data

US 2002/0045963 A1 Apr. 18, 2002

(30) Foreign Application Priority Data

Oct. 13, 2000 (JP) .......................... 2000-313422

(51) Int. Cl.[7] .......................... G06F 19/00; G06T 15/00
(52) U.S. Cl. .......................... 700/96; 700/95; 345/419; 345/501
(58) Field of Search .......................... 700/182, 95, 111, 700/112, 190; 345/240, 501, 419; 382/240

(56) References Cited

U.S. PATENT DOCUMENTS

| | | | |
|---|---|---|---|
| 5,533,148 A | * | 7/1996 | Sayah et al. ............ 382/240 |
| 5,751,927 A | * | 5/1998 | Wason .................... 345/419 |
| 5,812,136 A | * | 9/1998 | Keondjian ............... 345/419 |
| 5,933,153 A | * | 8/1999 | Deering et al. ......... 345/501 |

FOREIGN PATENT DOCUMENTS

| | | |
|---|---|---|
| JP | HEI 6-231194 | 8/1994 |
| JP | 3092596 | 9/2000 |

* cited by examiner

Primary Examiner—Albert W. Paladini
Assistant Examiner—W. Russell Swindell
(74) Attorney, Agent, or Firm—Staas & Halsey LLP

(57) ABSTRACT

A CAD supporting apparatus supports an assembling of an assembly by a CAD for assembling an assembly constituted of a plurality of components, which creates a geometry of objects, in cooperation with the CAD. The CAD supporting apparatus has: a data separating section for separating, upon receipt of CAD data representative of an assembly, which has a format suitable for being dealt with the CAD, from the CAD, the CAD data into structure data representative of a structure of the assembly, geometry data representative of a geometry of components constituting the assembly, and position data representative of a position of components on the assembly; an attribute set up section for setting up an attribute onto data separated by said data separating section in accordance with the operation; and a CAD data reconstruction section for creating CAD data representative of an assembly, which has a format suitable for being dealt with in the CAD, from data separated by said data separating section and reflecting the attribute set up by said attribute set up section, and for transmitting the CAD data created to the CAD.

10 Claims, 11 Drawing Sheets

DATA OF ASSEMBLY A : STRUCTURE INFORMATION INDICATING THAT ASSEMBLY A COMPRISES ASSEMBLY B, ASSEMBLY C AND ASSEMBLY D, AND THEIR POSITION INFORMATION

DATA OF ASSEMBLY B : STRUCTURE INFORMATION INDICATING THAT ASSEMBLY B COMPRISES ASSEMBLY E AND ASSEMBLY F, AND THEIR POSITION INFORMATION

DATA OF ASSEMBLY C : STRUCTURE INFORMATION INDICATING THAT ASSEMBLY C COMPRISES ASSEMBLY G AND ASSEMBLY H, AND THEIR POSITION INFORMATION

DATA OF COMPONENT D: GEOMETRY DATA

DATA OF COMPONENT E: GEOMETRY DATA

DATA OF COMPONENT F: GEOMETRY DATA

DATA OF COMPONENT G: GEOMETRY DATA

DATA OF COMPONENT H: GEOMETRY DATA

Fig. 5

STRUCTURE: ASSEMBLY A=(ASSEMBLY B [COMPONENT E, COMPONENT F], ASSEMBLY C [COMPONENT G, COMPONENT H], COMPONENT D)

POSITION: ASSEMBLY B=(X, Y, Z, i, j, k), ASSEMBLY C=(X, Y, Z, i, j, k), · · ·

SHAPE:

CAD SUPPORTING APPARATUS, AND CAD SUPPORTING PROGRAM STORAGE MEDIUM

BACKGROUND OF THE INVENTION

1. Field of the Invention

The present invention relates to a CAD (Computer Aided Design) supporting apparatus for supporting an assembling of an assembly by a CAD for assembling on data an assembly constituted of a plurality of components, which creates a geometry of objects, in cooperation with the CAD, and a CAD supporting program storage medium storing a CAD supporting program, when executed in a computer, which causes the computer to operate as the CAD supporting apparatus.

2. Description of the Related Art

Recently, to design various types of devices and apparatuses, instead of drawing of a plan on a paper by a designer, there is widely adopted, for example, a design technology that a CAD, which is constructed in a computer, is used to form a geometry of objects on data, so that an assembly (components constituting a device or a part of the device) constituted of a plurality of objects is set up on data. An adoption of the CAD makes it easy to perform a design and a modification of the design, and it is possible to remarkably reduce a developing term and a developing cost.

The CAD performs a control of various attributes on respective components as well as creation and modification of a geometry of components.

For example, with respect to a display, there is performed a control of a display attribute such as providing "display", "maximum external form display" or "non-display" for each component, in such a manner that to make a rough consideration for size and layout of a certain component, the maximum external form is displayed with a block with which the component is inscribed instead of a minute outline display, or to avoid a troublesomeness of observation due to display of a number of components, a non-display is provided for a certain component.

Further, there is performed a control of various attributes on components, such as a management of the progress situation of a design of each of the components of an assembly on a CAD, and an alarm of informing that a design of a certain component is not yet completed.

The CAD performs the above-mentioned various attribute controls. For example, when it is intended that the "display" of displaying for a certain component is changed to the "non-display" of erasing it from the screen, data of the assembly including the component is read to change attribute data of the "display" and the "non-display" as to the noticed component, of the data thus read, from the "display" to the "non-display". This is similar in a situation that it is intended to provide such a set up that data of a certain component is not outputted to the exterior. Data of the assembly including the component is read to rewrite attribute data of the noticed component.

By the way, it takes a long time to read assembly data. Specifically, to read data of an assembly composed of components of 1000 points or so for instance, the general CAD takes about one hour. For this reason, in some operating procedure of the CAD, it takes one hour to change the "display" to the "non-display" with respect to one component. This brings about the possibility that efficiency of a design work using the CAD is extremely deteriorated.

SUMMARY OF THE INVENTION

In view of the foregoing, it is an object of the present invention to provide a CAD supporting apparatus for supporting a set-up of an assembly by a CAD for establishing on data an assembly constituted of a plurality of components, which creates a geometry of objects, in cooperation with the CAD, so that a design work using the CAD can be effectively performed, and a CAD supporting program storage medium storing a CAD supporting program, when executed in a computer, which causes the computer to operate as the CAD supporting apparatus.

To achieve the above-mentioned object, the present invention provides a first CAD supporting apparatus for supporting an assembling of an assembly by a CAD for assembling an assembly constituted of a plurality of components, which creates a geometry of objects, in cooperation with the CAD, said CAD supporting apparatus comprising:

a data separating section for separating, upon receipt of CAD data representative of an assembly, which has a format suitable for being dealt with the CAD, from the CAD, the CAD data into structure data representative of a structure of the assembly, geometry data representative of a geometry of components constituting the assembly, and position data representative of a position of components on the assembly;

an attribute set up section for setting up an attribute onto data separated by said data separating section in accordance with the operation; and a CAD data reconstruction section for creating CAD data representative of an assembly, which has a format suitable for being dealt with in the CAD, from data separated by said data separating section and reflecting the attribute set up by said attribute set up section, and for transmitting the CAD data created to the CAD.

In the first CAD supporting apparatus according to the present invention as mentioned above, it is acceptable that said attribute set up section sets up in accordance with the operation at least a display attribute representative of display or non-display of components, a confidentiality attribute representative of permission or prohibition of output of components data, and information attribute representative of progress situation of a creation of the components.

As mentioned above, to read data for an assembly consisting of 1000 points or so of components for example, it takes a so long of time for example 1 hour or so. In this case, it takes about 98% time for reading geometry data representative of a geometry of components.

The feature of the first CAD supporting apparatus according to the present invention as mentioned above makes it extremely easy to perform set up and alteration of various types of attribute, and thereby greatly contributing to making efficiency of a design work using a CAD.

In the first CAD supporting apparatus according to the present invention as mentioned above, it is preferable that said CAD data reconstruction section has a function in which of the structure data, the geometry data, and the position data, the structure data and the position data excepting the geometry data are converted into CAD data suitable for another CAD which deals with CAD data different in data format from the CAD data dealt with in said CAD.

It is usual that there exist various types of CAD and they are not compatible with one another. Particularly, with respect to the geometry data, not only a data format is different between the types of CAD, but also contents of data are different between the types of CAD, and thus it is difficult to transfer data between different types of CAD.

On the other hand, with respect to the structure data and the position data, contents of data are basically identical between the different types of CAD per se, while different in data format.

According to the first CAD supporting apparatus of the present invention as mentioned above, the data is separated into the structure data, the geometry data and the position data. This feature makes it possible to transform the structure data and the position data to CAD data suitable for another CAD. It is to be noted that what is transmitted between a plurality of CAD's is mainly the structure data and the position data. Consequently, in the event that there is provided such a construction that only the structure data and the position data are received and transmitted, with respect to the geometry data, the use of one's own geometry data of the CAD data makes it possible to perform a design work on a share basis by mutually different types of CAD's.

In the CAD supporting apparatus according to the present invention as mentioned above, it is preferable that said attribute set up section sets up in accordance with the operation the confidentiality attribute representative of permission or prohibition of output of components data, and said CAD data reconstruction section creates CAD data in which data associated with components involved in an instruction of the prohibition of output of components data by said attribute set up section is deleted.

According to such an arrangement, in transmission of data to for example, a customer or client, or a business connection, for the purpose of keeping a secret, it is possible to prevent data from being transmitted with respect to a certain component.

To achieve the above-mentioned object, the present invention provides a second CAD supporting apparatus for supporting an assembling of an assembly by a CAD for assembling an assembly constituted of a plurality of components, which creates a geometry of objects, in cooperation with the CAD, said CAD supporting apparatus comprising:

a text data obtaining section for obtaining text data describing a structure of the assembly; and a CAD creating section for interpreting the text data obtained by said text data obtaining section, and referring to a database 30 that stores geometry data representative of a geometry of components, to create CAD data of a format suitable for being dealt with in the CAD in accordance with the text data.

According to the conventional CAD, to assemble an assembly, components are read one by one from a database in accordance with an operation of an operator, and regarding components, which do not exist in the database, the components are made up one by one. To the contrary, according to the second CAD supporting apparatus, a description of the specification of an assembly in form of a text makes it possible to create CAD data, excepting a portion that is necessary to be newly created, which does not exist in the database, while referring to the database. Accordingly, it is unnecessary for an operator to read components one by one from the database, and it is effective to start from a work for creating a new component. Thus it is possible to greatly improve the design work using the CAD.

To achieve the above-mentioned object, the present invention provides a first CAD supporting program storage medium storing a CAD supporting program which causes a computer to operate as a CAD supporting apparatus for supporting an assembling of an assembly by a CAD for assembling an assembly constituted of a plurality of components, which creates a geometry of objects, in cooperation with the CAD, when the CAD supporting program is executed in the computer, wherein said CAD supporting program storage medium stores the CAD supporting program comprising:

a data separating section for separating, upon receipt of CAD data representative of an assembly, which has a format suitable for being dealt with the CAD, from the CAD, the CAD data into structure data representative of a structure of the assembly, geometry data representative of a geometry of components constituting the assembly, and position data representative of a position of components on the assembly;

an attribute set up section for setting up an attribute onto data separated by said data separating section in accordance with the operation; and a CAD data reconstruction section for creating CAD data representative of an assembly, which has a format suitable for being dealt with in the CAD, from data separated by said data separating section and reflecting the attribute set up by said attribute set up section, and for transmitting the CAD data created to the CAD.

In the first CAD supporting program storage medium according to the present invention as mentioned above, it is acceptable that said attribute set up section sets up in accordance with the operation at least a display attribute representative of display or non-display of components, a confidentiality attribute representative of permission or prohibition of output of components data, and information attribute representative of progress situation of a creation of the components.

In first CAD supporting program storage medium according to the present invention as mentioned above, it is preferable that said CAD data reconstruction section has a function in which the structure data, the geometry data, and the position data are converted into CAD data suitable for another CAD which deals with CAD data different in data format from the CAD data dealt with in said CAD.

In first CAD supporting program storage medium according to the present invention as mentioned above, it is preferable that said attribute set up section sets up in accordance with the operation the confidentiality attribute representative of permission or prohibition of output of components data, and said CAD data reconstruction section creates CAD data in which data associated with components involved in an instruction of the prohibition of output of components data by said attribute set up section is deleted.

To achieve the above-mentioned object, the present invention provides a second CAD supporting program storage medium storing a CAD supporting program which causes a computer to operate as a CAD supporting apparatus for supporting an assembling of an assembly by a CAD for assembling an assembly constituted of a plurality of components, which creates a geometry of objects, in cooperation with the CAD, when the CAD supporting program is executed in the computer, wherein said CAD supporting program storage medium stores the CAD supporting program comprising:

a text data obtaining section for obtaining text data describing a structure of the assembly; and a CAD creating section for interpreting the text data obtained by said text data obtaining section, and referring to a database 30 that stores geometry data representative of a geometry of components, to create CAD data of a format suitable for being dealt with in the CAD in accordance with the text data.

BRIEF DESCRIPTION OF THE DRAWINGS

FIG. 5 is a view showing a data structure in a CAD with respect to the assembly shown in FIG. 4.

DETAILED DESCRIPTION OF PREFERRED EMBODIMENTS

Embodiments of the present invention will be described with reference to the accompanying drawings.

Figure 1:
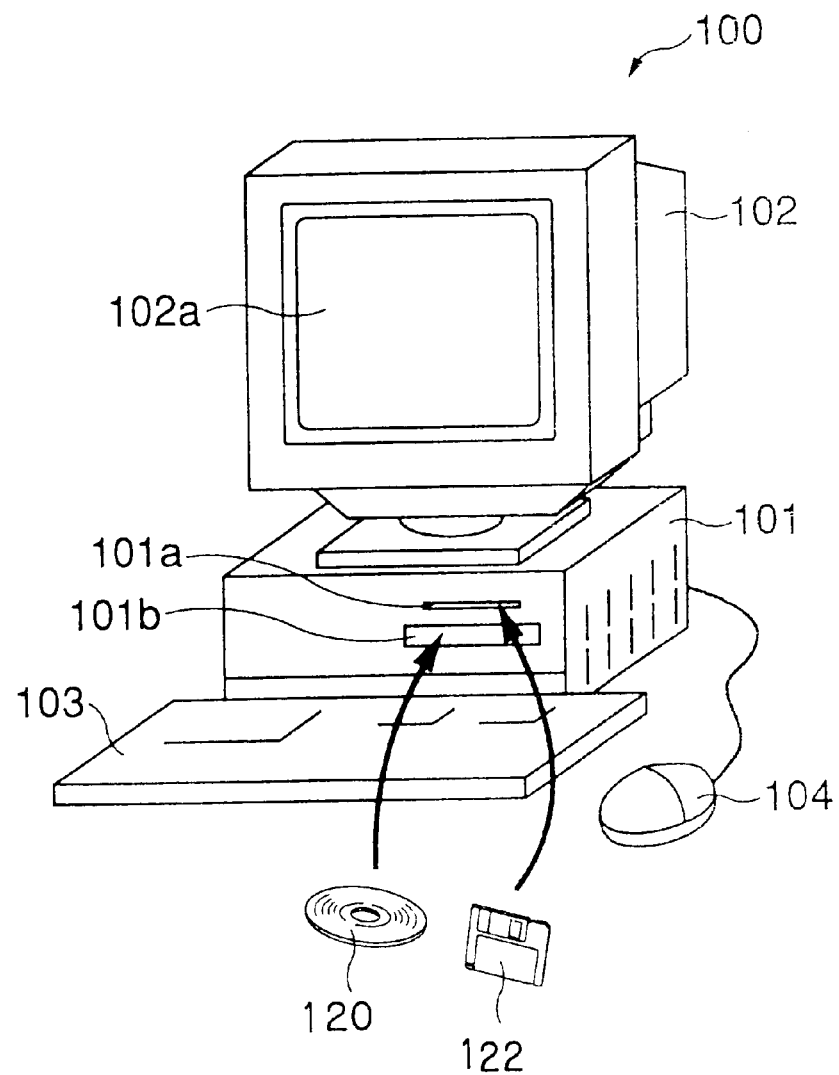
FIG. 1 is a view showing an embodiment of a CAD supporting apparatus according to the present invention.

FIG. 1 is a view showing an embodiment of a CAD supporting apparatus according to the present invention.

A CAD supporting apparatus 100 is constituted of a CAD and a computer system. The CAD supporting apparatus 100 comprises: a main frame unit 101 incorporating therein a CPU, a RAM memory, a hard disk, etc.; a CRT display unit 102 for displaying an image on a display screen 102a in accordance with an instruction from the main frame unit 101; a keyboard 103 for entering various sorts of information such as user's instructions and character information to the computer system in accordance with a key operation, and a mouse 104 for inputting an instruction according to, for example, an icon and the like, through designation of an optional position on the display screen 102a, the icon and the like being displayed on the position on the display screen 102a.

The main frame unit 101 has a floppy disk mounting slot 101a for mounting a floppy disk 122, and a CD-ROM mounting slot 101b for mounting a CD-ROM 120. The main frame unit 101 incorporates therein a floppy disk drive for driving the floppy disk 122 mounted thereon, a CD-ROM drive for driving the CD-ROM 120 mounted thereon.

The CD-ROM 120 stores therein a CAD supporting program referred to in the present invention. The CD-ROM 120 is mounted on the main frame unit 101 through the CD-ROM mounting slot 101b so that the CAD supporting program stored in the CD-ROM 120 by the CD-ROM drive is installed in the hard disk of the computer system. When the CAD supporting program installed in the hard disk of the computer system is activated, the computer system operates as an embodiment of the CAD supporting apparatus of the present invention.

Accordingly, the CD-ROM 120 storing the CAD supporting program corresponds to an embodiment of the CAD supporting program storage medium.

While the CAD supporting program stored in the CD-ROM 120 is installed in the hard disk of the computer system in the manner as mentioned above, the hard disk in which the CAD supporting program is installed also corresponds to an embodiment of the CAD supporting program storage medium.

Further, when the CAD supporting program is downloaded onto a floppy disk or the like, the floppy disk or the like storing the CAD supporting program downloaded also corresponds to an embodiment of the CAD supporting program storage medium.

Figure 2:
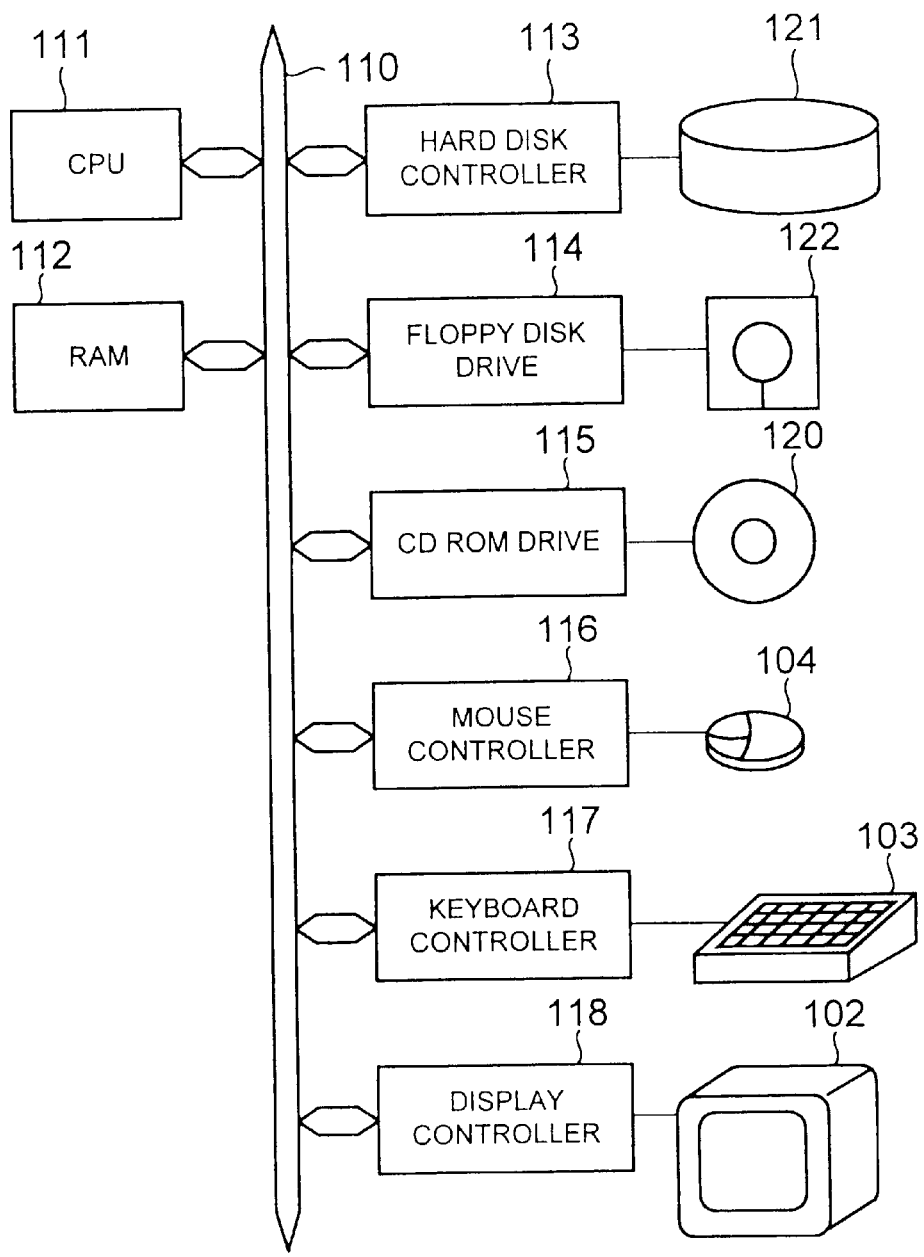
FIG. 2 is a hardware structural view of the CAD supporting apparatus (a computer system) having the external appearance shown in FIG. 1.

FIG. 2 is a hardware structural view of the CAD supporting apparatus (a computer system) having the external appearance shown in FIG. 1.

The CAD supporting apparatus (a computer system) comprises a central processing unit (CPU) 111, a RAM 112, a hard disk controller 113, a floppy disk drive 114, a CD-ROM drive 115, a mouse controller 116, a keyboard controller 117, and a display controller 118. These various types of elements are mutually connected via a bus 110.

The floppy disk drive 114 and the CD-ROM drive 115, to which the floppy disk 122 and the CD-ROM 120 are mounted, respectively, as described with reference to FIG. 1, are for accessing the floppy disk 122 and the CD-ROM 120, respectively.

Figure 3:
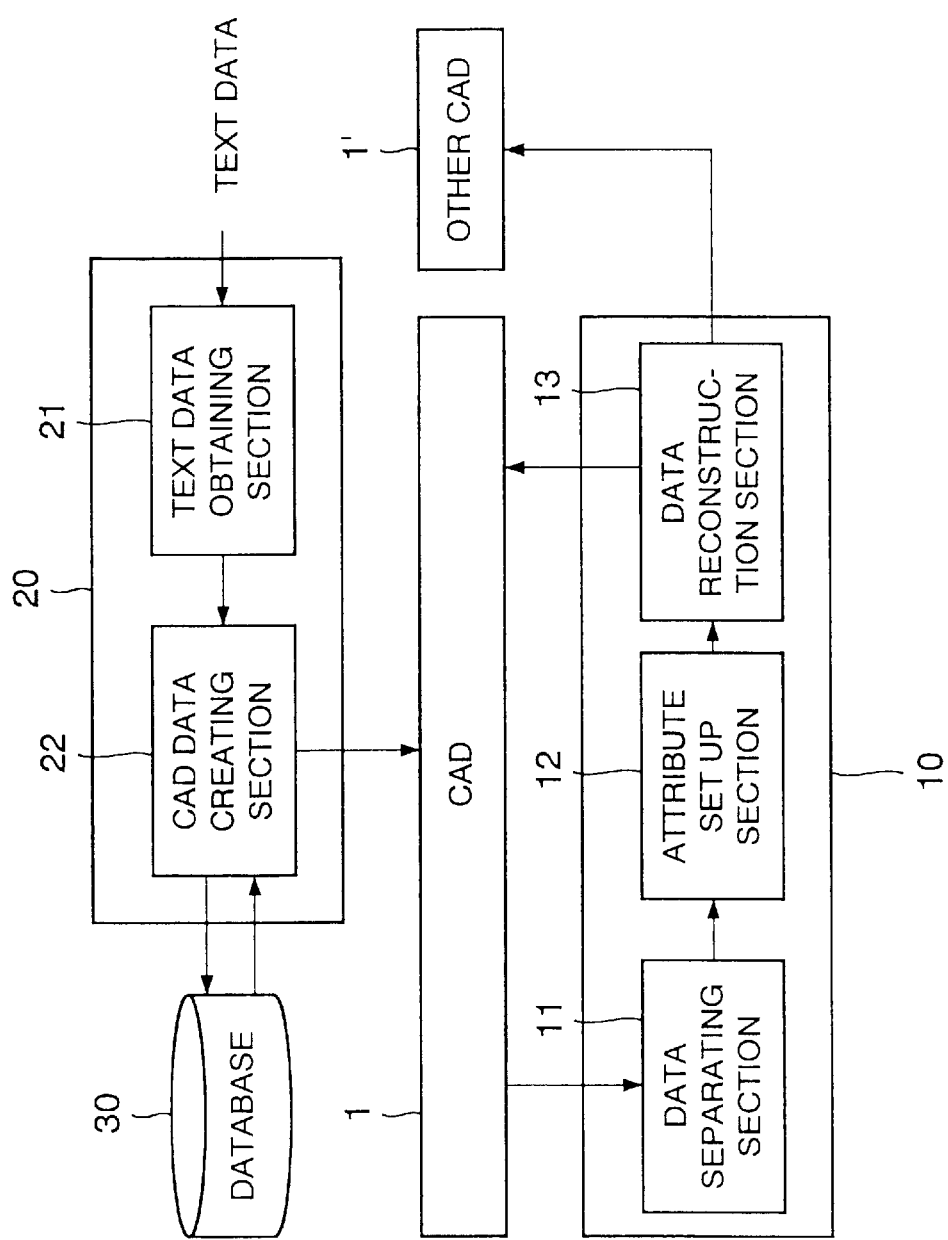
FIG. 3 is a functional block diagram of a CAD supporting system constructed in the computer shown in FIGS. 1 and 2.

In FIG. 3, there are shown a hard disk 121 accessed by the hard disk controller 113, a mouse 104 controlled by the mouse controller 116, a keyboard 103 controlled by the keyboard controller 117, and a CRT display controlled by the display controller 118.

FIG. 3 is a functional block diagram of a CAD supporting system constructed in the computer shown in FIGS. 1 and 2. In the computer shown in FIGS. 1 and 2, there is also constructed a CAD system. In FIG. 3, a CAD 1 is shown with a block. It is assumed that another CAD 1' shown in FIG. 3 is constructed in another computer system separated from the computer system shown in FIGS. 1 and 2.

While FIG. 3 shows a first CAD supporting apparatus 10 and a second CAD supporting apparatus 20, there will be first described the second CAD supporting apparatus 20.

The second CAD supporting apparatus 20 comprises a text data obtaining section 21 and a CAD data creating section 22.

The text data obtaining section 21 obtains text data describing a structure of an assembly to be created using the CAD 1. On a hardware basis, for example, in the event that the text data is inputted using the keyboard 103 (cf. FIGS. 1 and 2), the keyboard 103 mainly corresponds to the text data obtaining section 21. In the event that the text data is read from the floppy disk 122 in which the text data is stored through entry by another computer or the like, the floppy disk drive 114 mainly corresponds to the text data obtaining section 21.

The CAD data creating section 22 interprets the text data obtained by the text data obtaining section 21, and refers to a database 30 that stores geometry data representative of a geometry of objects or components, so that there is created CAD data of a format suitable for being dealt with in CAD 1 in accordance with the text data.

In this case, it is effective that the CAD 1 performs, upon receipt of the CAD data created by the CAD data creating section 22, production of geometry data for components that do not exist on the database 30, and production of the alteration portion from the text data. This makes it possible to remarkably improve a design work using CAD 1 in efficiency.

On the other hand, the first CAD supporting apparatus 10 comprises a data separating section 11, an attribute set up section 12, and data reconstruction section 13.

The data separating section 11 separates, upon receipt of CAD data representative of an assembly halfway through the set up, which has a format suitable for being dealt with in CAD 1, from the CAD 1, the CAD data into structure data representative of the structure of the assembly, geometry data representative of the geometry of components constituting the assembly, and position data representative of the position of components on the assembly.

The attribute set up section 12 sets up an attribute on data separated by the data separating section 11 in accordance with the operation. More in detail, the attribute set up section 12 sets up in accordance with the operation a display attribute representative of display or non-display of components, a confidentiality attribute representative of permission or prohibition of output of components data, and information attribute representative of progress situation of a creation of the components.

The data reconstruction section 13 creates CAD data representative of an assembly halfway through the set up, which has a format suitable for being dealt with in CAD 1, from data separated by the data separating section 11 and reflecting the attribute set up by the attribute set up section 12. The CAD data thus created is transmitted to the CAD 1.

In this manner, the first CAD supporting apparatus 10 separates, upon receipt of CAD data, the CAD data into the structure data, the geometry data, and the position data. Thus, to set up the attribute onto the respective components, it is effective for one that needs no geometry data that only the structure data or the position data is read. This feature makes it possible to readily perform the set up and the alteration of the attribute. The data subjected to the processes of the set up and the alteration of the attribute is returned to the CAD through a re-conversion into the CAD data of a format suitable for being dealt with in the CAD, so that the CAD can continue the design work in accordance with received CAD data.

The data reconstruction section 13 has a function in which of the structure data, the geometry data, and the position data, the structure data and the position data excepting the geometry data are converted into CAD data suitable for another CAD 1' which deals with CAD data different in data format from the CAD data dealt with in the CAD 1. The CAD data suitable for another CAD 1', which is created by the data reconstruction section 13, is down-loaded onto for example, the floppy disk 122, and is installed in another computing system (not illustrated) in which another CAD 1' is constructed. This makes it possible for another CAD 1' to refer to the data created in the CAD 1 while using one's own data with respect to the geometry data.

As mentioned above, while the attribute set up section 12 sets up in accordance with the operation a confidentiality attribute representative of permission or prohibition of output of components data, the data reconstruction section 13 creates CAD data deleting data involved in components designated with prohibition of output of components data by the attribute set up section 12. Thus, for example, to transfer data to a customer or a business connection, this makes it possible to maintain confidentiality of a new product development so as not to transfer the data with respect to a certain component. Alternatively, there is a case where when none of data is outputted for a certain component, a position relation with other components becomes ambiguous. In this case, as will be described, the attribute "structure information" is set up. This makes it possible to create CAD data having such a degree of information that the data reconstruction section can grasp the fact that there exists components over there.

Figure 4:
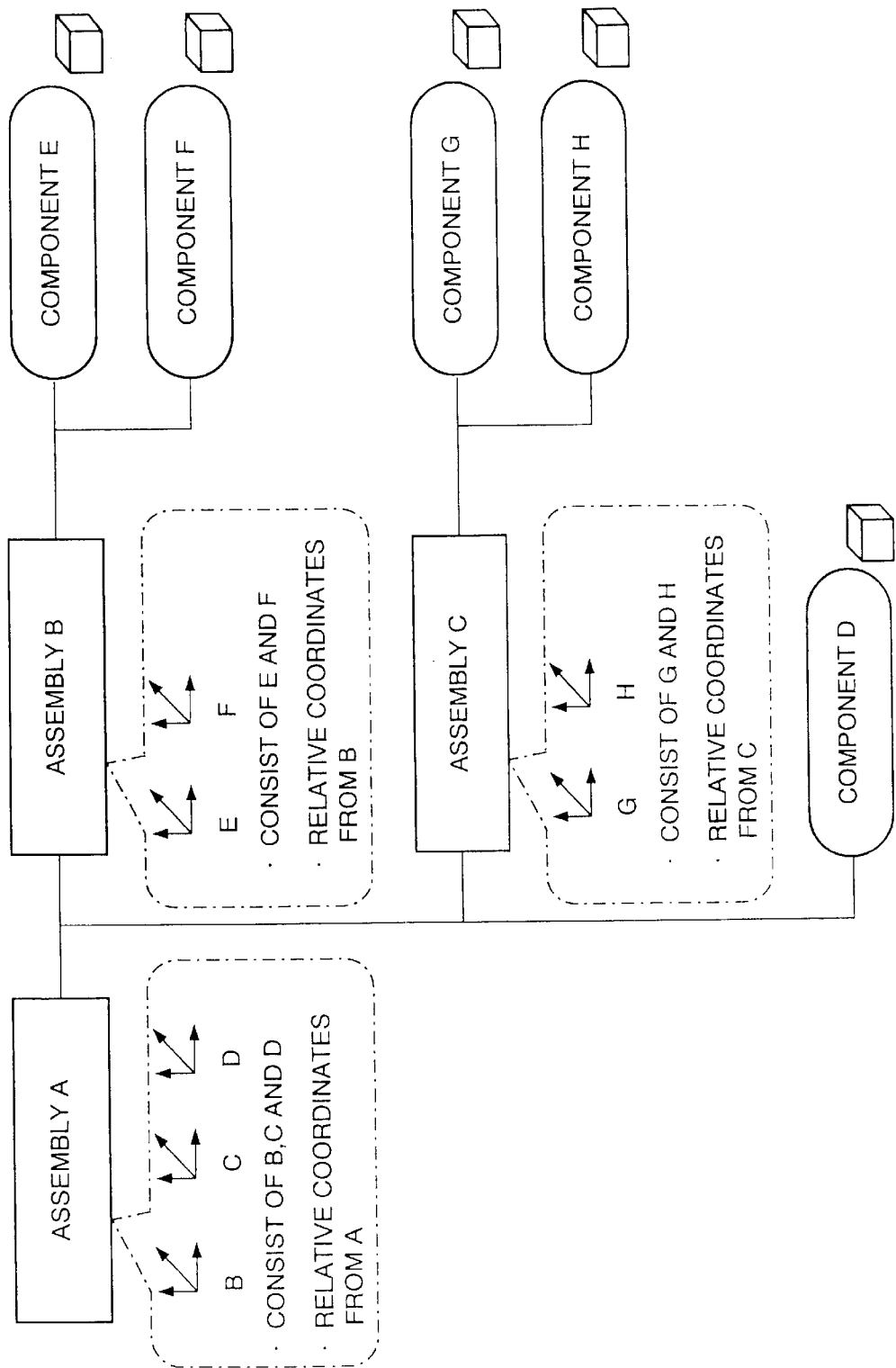
FIG. 4 is a typical illustration showing a structure of an assembly.
Figure 6:
FIG. 6 is a view showing a data structure in a first CAD supporting apparatus with respect to the assembly shown in FIG. 4.

FIG. 4 is a typical illustration showing a structure of an assembly. FIG. 5 is a view showing a data structure in a CAD with respect to the assembly shown in FIG. 4. FIG. 6 is a view showing a data structure in the first CAD supporting apparatus 10 with respect to the assembly shown in FIG. 4.

As shown in FIG. 4, an assembly A comprises an assembly B, an assembly C, and a component D. In the CAD, as shown in FIG. 5, as data of the assembly A, there are described structure information that the assembly A comprises the assembly B, the assembly C, and the component D, and their position information (relative coordinates from the starting point of the assembly A) of the assembly B, the assembly C, and the component D.

An assembly B comprises a component E and a component F. In the CAD, as shown in FIG. 5, as data of the assembly B, there are described structure information that the assembly B comprises the component E and the component F, and their position information (relative coordinates from the starting point of the assembly B) of the component E and the component F. Likewise, an assembly C comprises a component G and a component H. In the CAD, as shown in FIG. 5, as data of the assembly C, there are described structure information that the assembly C comprises the component G and the component H, and their position information (relative coordinates from the starting point of the assembly C) of the component G and the component H.

Further, as data of components D, E, F, G, and H, there are described geometry data of the components D, E, F, G, and H.

When a CAD, which deals with CAD data of the data structure shown in FIG. 5, reads this assembly data, first, data of the assembly A is referred to so that it is recognized that the assembly A includes the assembly B, and then data of the assembly B is referred to so that it is recognized that the assembly B comprises the component E and the component F, and finally data of the component E and the component F are read. Next, it is recognized that the assembly A includes the assembly C, and then data of the assembly C is referred to so that it is recognized that the assembly C comprises the component G and the component H, and finally data of the component G and the component H are read. Further, it is recognized that the assembly A includes the component D, and data of the component D is read. In this manner, all data as to the assembly A are read to display the assembly A. The set up of the attribute such as "display" or "non-display" of components is performed on the components constituting the displayed assembly A. In this case, since the entire datum as to the assembly A are read, those data include geometry data of the components D, E, F, G, and H. An amount of data of the geometry data of those components is extremely large, and it takes a lot of time to read the data.

To the contrary, according to the CAD supporting apparatus 10, upon receipt of CAD data having the data structure for example shown in FIG. 5 from the CAD 1, the data separating section 11 shown in FIG. 3 separates the received CAD data into structure data, position data and geometry data, as shown in FIG. 6. In case of the tree structure shown in FIG. 4, the structure data has, as shown in FIG. 6, a data structure that "assembly A comprises assembly B consisting of component E and component F, assembly C consisting of component G and component H, and component D". The position data has a data structure such as position (X, Y, Z) and attitude (i, j, k) of assembly B, position (X, Y, Z) and attitude (i, j, k) of assembly C, . . . . The geometry data has data of geometry of components D, E, F, G, and H.

The first CAD supporting apparatus 10 shown in FIG. 3 manages data, as show in FIG. 6, in such a manner that the data is completely separated into the structure data, the position data and the geometry data. Accordingly, to set up the attributes of for example, "display" and "non-display" by the attribute set up section 12, it is effective that there is performed such a processing that only the structure data and the position data are read, and for example, in a case where "non-display" is set up, the structure data and the position data involved in the component that is intended to be set up to the non-display, are deleted. There is no need to call the geometry data. This feature makes it possible to achieve a high speed processing.

Figure 7:
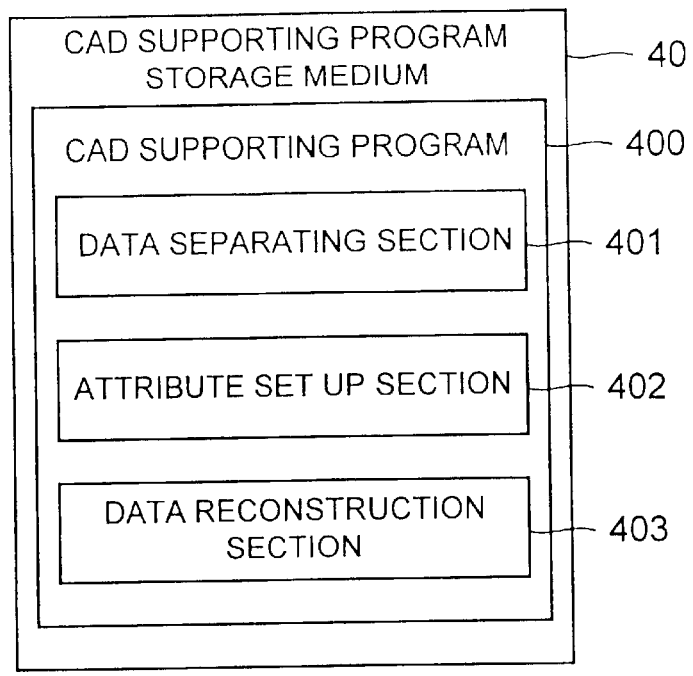
FIG. 7 is a program structural view showing an embodiment of a first CAD supporting program storage medium according to the present invention.

FIG. 7 is a program structural view showing an embodiment of a first CAD supporting program storage medium according to the present invention.

A CAD supporting program storage medium 40 shown in FIG. 7 stores a CAD supporting program 400. The CAD supporting program storage medium 40 is typically shown for the CD-ROM 120, the hard disk 121 and the floppy disk 122, which store the CAD supporting program 400.

The CAD supporting program 400, which is stored in the CAD supporting program storage medium 40, causes a computer to operate as an embodiment of the first CAD supporting program storage medium according to the present invention, when the CAD supporting program 400 is installed onto the computer and is executed. The CAD supporting program 400 comprises a data separating section 401, an attribute set up section 402, and a data reconstruction section 403. The data separating section 401, the attribute set up section 402 and the data reconstruction section 403 correspond to the data separating section 11, the attribute set up section 12 and the data reconstruction section 13, respectively, of the first CAD supporting apparatus 10 shown in FIG. 3. While the same names are applied to the structure elements in FIGS. 3 and 7, each of the structure elements of the first CAD supporting apparatus 10 shown in FIG. 3 consists of a compound of the hardware and the software, and on the other hand, each of the structure elements of the CAD supporting program 400 shown in FIG. 7 denotes only the application program of the hardware and the software. Functional effect of each of the structure elements has been explained referring to FIG. 3. Thus, the redundant explanation will be omitted.

Figure 8:
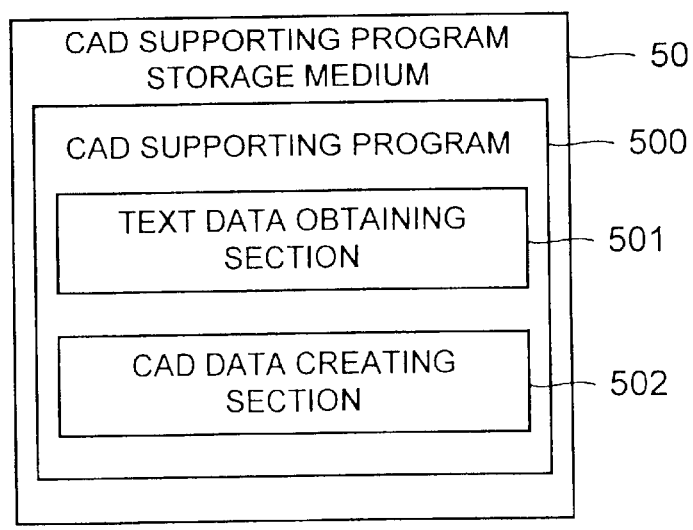
FIG. 8 is a program structural view showing an embodiment of a second CAD supporting program storage medium according to the present invention.

FIG. 8 is a program structural view showing an embodiment of a second CAD supporting program storage medium according to the present invention.

A CAD supporting program storage medium 50 shown in FIG. 8 stores a CAD supporting program 500. The CAD supporting program storage medium 50 is typically shown for the CD-ROM 120, the hard disk 121 and the floppy disk 122, which store the CAD supporting program 500, on a similar fashion to that of the CAD supporting program 400 shown in FIG. 7.

The CAD supporting program 500, which is stored in the CAD supporting program storage medium 50, causes a computer to operate as an embodiment of the second CAD supporting program storage medium according to the present invention, when the CAD supporting program 500 is installed onto the computer and is executed. The CAD supporting program 500 comprises a text data obtaining section 501, and a CAD data creating section 502. The text data obtaining section 501, and the CAD data creating section 502 correspond to the text data obtaining section 21 and the CAD data creating section 22, respectively, of the second CAD supporting apparatus 20 shown in FIG. 3. While the same names are applied to the structure elements in FIGS. 3 and 8, each of the structure elements of the second CAD supporting apparatus 20 shown in FIG. 3 consists of a compound of the hardware and the software, and on the other hand, each of the structure elements of the CAD supporting program 500 shown in FIG. 8 denotes only the application program of the hardware and the software. Functional effect of each of the structure elements has been explained referring to FIG. 3. Thus, the redundant explanation will be omitted.

Figure 9:
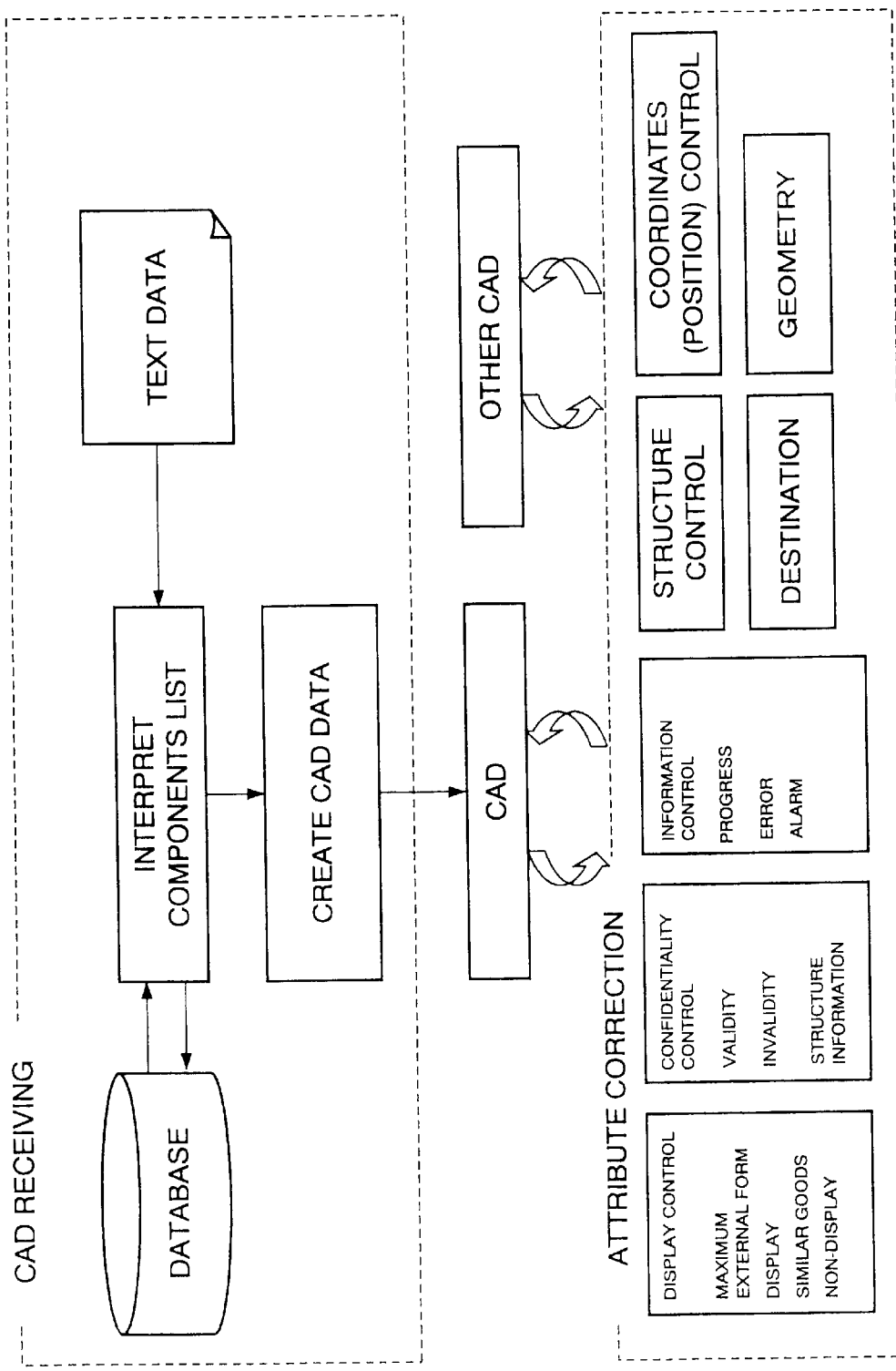
FIG. 9 is a view showing a specific structural example of the CAD supporting program operative in the computer system shown in FIGS. 1 and 2.

FIG. 9 is a view showing a specific structural example of the CAD supporting program operative in the computer system shown in FIGS. 1 and 2. Hereinafter, there will be explained flowcharts of FIGS. 10 to 12 referring to FIG. 9.

Figure 10:
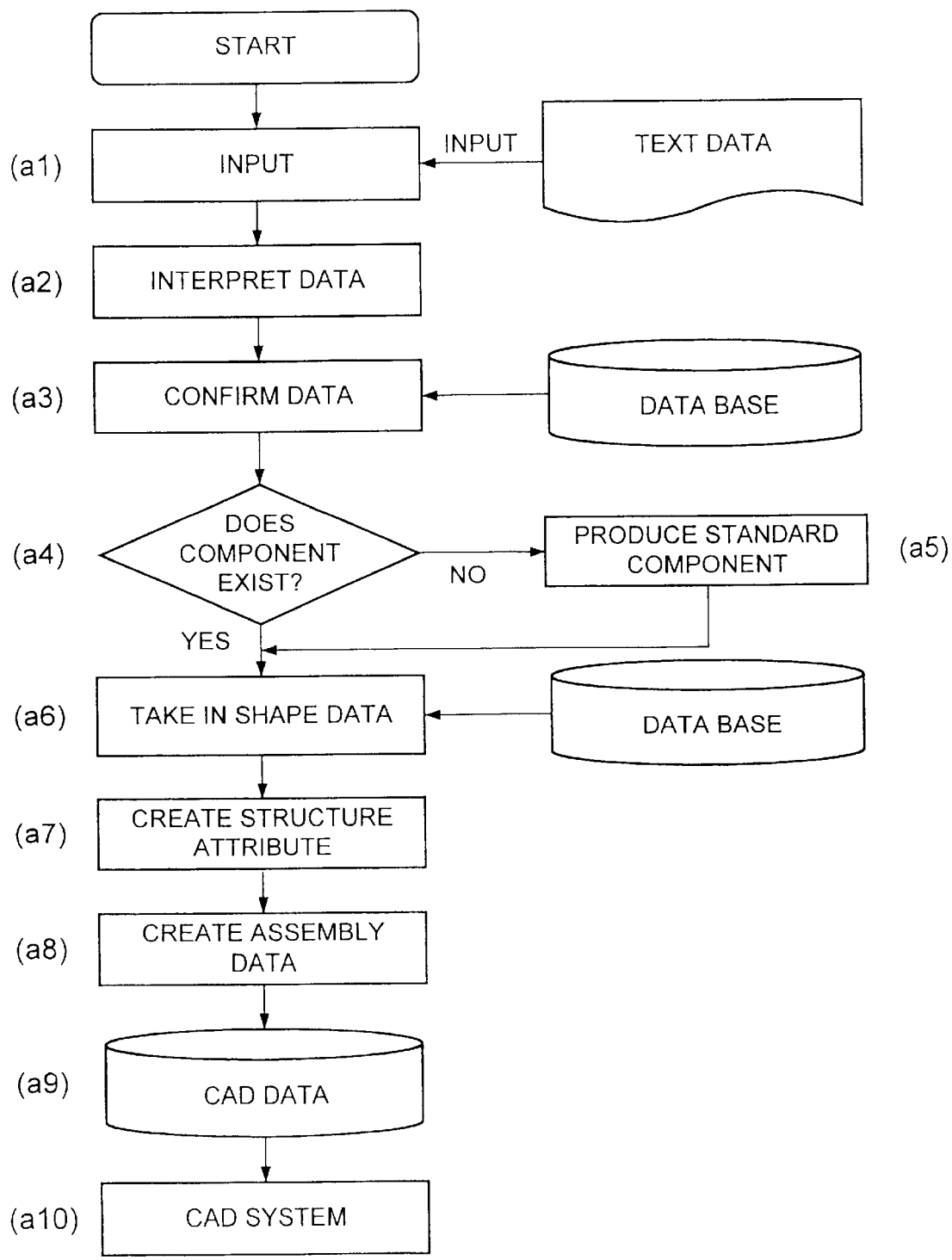
FIG. 10 is a CAD supporting program operative in "CAD receiving".

A portion of "CAD receiving" in FIG. 9 corresponds to the second CAD supporting apparatus 20 shown in FIG. 3. FIG. 10 is a CAD supporting program operative in "CAD receiving".

First, text data is entered (step a1). The text data is representative of a component list. The step a1 corresponds to an example of the text data obtaining section of the CAD supporting program stored in the second CAD supporting program storage medium of the present invention.

Next, the entered text data is interpreted and is transformed into a component list of a predetermined format (step a2). Entire components and assembly parts interpreted in the step a2 are retrieved from a database in which geometry data for a number of components is stored (step a3).

In step a4, it is determined on each of the components in accordance a retrieval result of the database whether data of the associated component exists in the database. In the event that no data of the associated component exist, there is produced a "standard component" having only a reference surface and a reference coordinates system, in which a geometry of the component is vacant (step a5).

In step a6, with respect to the component existing in the database, geometry data associated with the component is read from the database to be taken into the program.

Next, in step a7, a structure attribute for automatically assembling components is added to a reference coordinates system of each of the components.

In step a8, assembly data is created from the component list interpreted in the step a2. In step a9, the assembly data created in the step a8, the geometry data received from the database in step a6, and the structure attribute added in the step a7 are used to create CAD data of a format dealt with in the CAD. In step a10, the CAD data created in the step a9 is transferred to the existing CAD system (e.g. ICAD/MX, UG, Pro/E, etc.).

The step a2 to step a10 corresponds to the CAD data creating section 22 of the CAD supporting program stored in the second CAD supporting program storage medium of the present invention.

Thus, according to the present embodiment, the CAD data is created from the text data and transferred to the CAD system. This feature makes it possible to remarkably save a design work using the CAD system.

Figure 11:
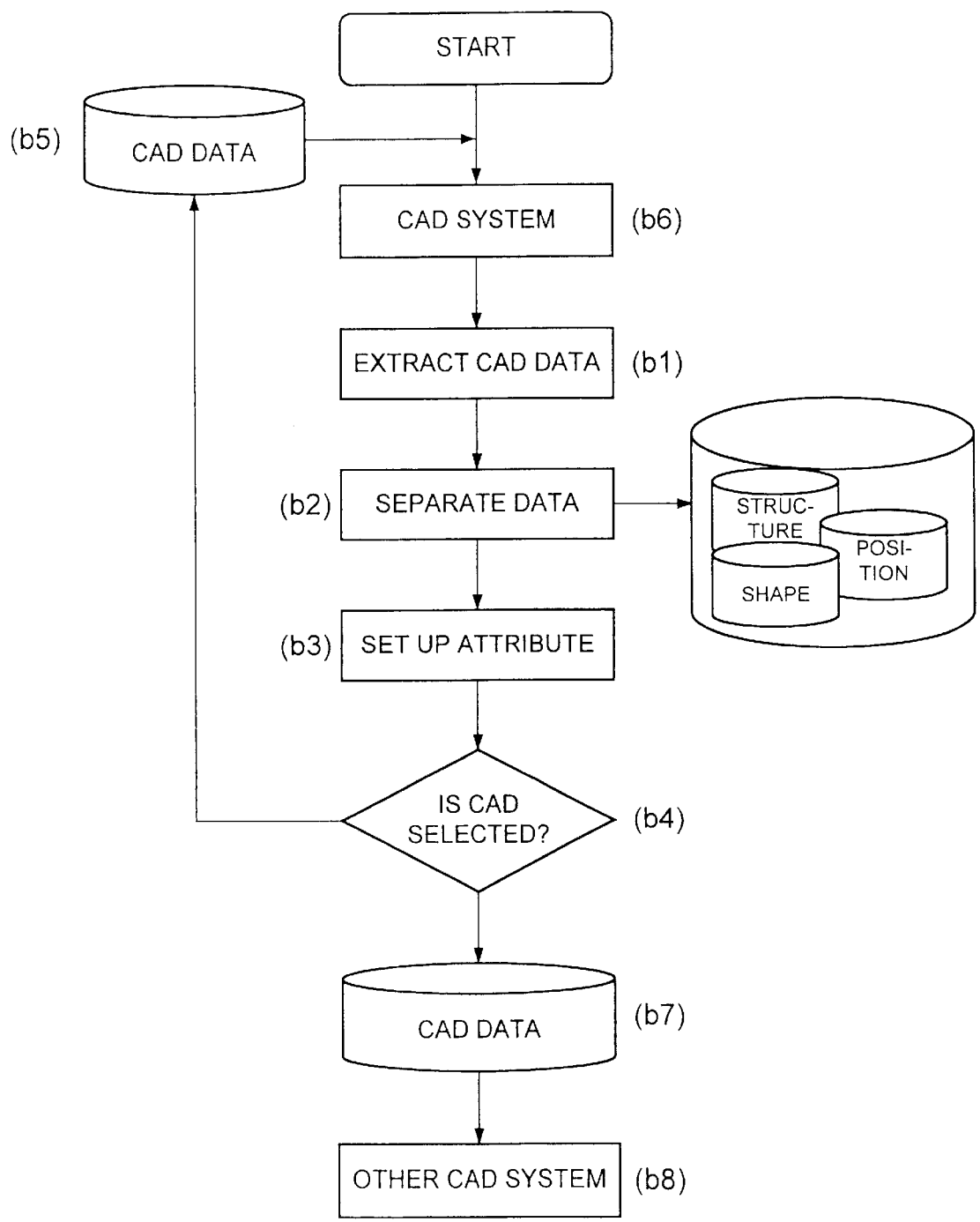
FIG. 11 is a CAD supporting program operative in "attribute correction".

A portion of the "attribute correction" in FIG. 9 corresponds to the first CAD supporting apparatus 10 shown in FIG. 3. FIG. 11 is a CAD supporting program operative in the "attribute correction".

In this program, first, CAD data of a format suitable for being dealt with in the CAD system is extracted from the existing CAD system (step b1). The extracted CAD data is separated into the structure data, the position data, and the geometry data (step b2).

The structure data denotes an absolute path (a path of a parentage on a tree structure up to the most significant position of assembly component) and a relative path (a path of a parentage between an assembly having a closest parentage and components) of components included in an assembly. The position data denotes coordinates and attitude from an absolute reference position (a reference position of a most significant position of assembly) wherein a component is disposed), and coordinates and attitude from a relative reference position (a reference position of a closest parent assembly). The geometry data denotes a geometry of components.

The "structure control" of the "attribute correction" shown in FIG. 9 implies the above-mentioned structure data and a program component for controlling the structure data. The "coordinates (position) control" implies the above-mentioned position data and a program component for controlling the position data. The "geometry" implies geometry data. The "destination" implies data indicating the destination of an assembly. The "display control", the "confidentiality control" and the "information control" will be described later.

In a step b3 of FIG. 11, an attribute is set up to each component in accordance with an operation of an operator so that attribute correction data is created. A detail of the step b3 will be described later.

In a step b4, there is made a selection as to whether the data after set up of the attribute in the step b3 is returned to the same CAD or another CAD. When it is decided that the data is returned to the same CAD, the structure data, the position data, and the geometry data, which are obtained through the data separation in the step b2, and the attribute correction data, which is set up in the step b3, are utilized to reconstruct a CAD data (step b5), and then the CAD data thus reconstructed is transmitted to the CAD system (step b6).

In the CAD system, which receives the CAD data, an operator performs a design of an assembly. When a new set up or an alteration of the attribute is required, the processes of the steps after the process for the CAD data extraction in step b1 are repeated.

When another CAD is selected in the step b4, there is created CAD data suitable for the another CAD in accordance with the structure data and the position data, of the structure data, the position data, and the geometry data, which are obtained through the data separation in the step b2, except the geometry data, and the attribute correction data, which is set up in the step b3 (step b7), and then the CAD data thus created is transmitted to the another CAD system (step b8). In the another CAD system, with respect to the geometry of the components, one's own self-data is used.

Figure 12:
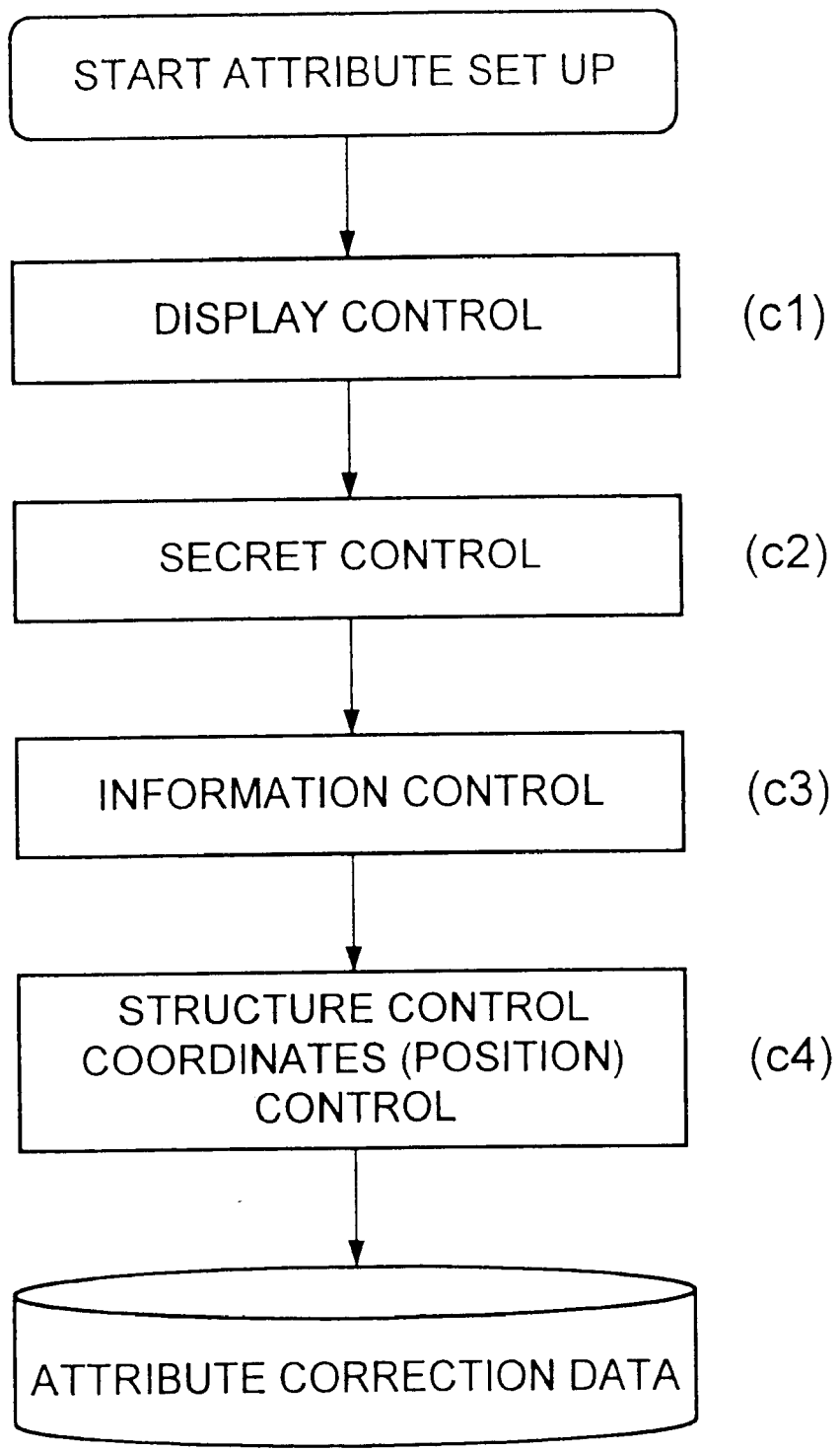
FIG. 12 is a flowchart useful for understanding "attribute set up".

FIG. 12 is a flowchart useful for understanding the "attribute set up" in the step b3 in FIG. 11.

First, the "display control" is performed (step c1). In the "display control", there is set up an attribute representative of a display format on the CAD in accordance with an operation of an operator. As the attributes to be set up here, there exist four sorts of "maximum external form", "display", "non-display" and "similar goods". The "maximum external form" implies to display a schematic figure with which the component of interest is inscribed so that a rough relationship with other components can be grasped. The "display" implies to display the component of interest. The "non-display" implies to non-display the component of interest. The "similar goods" implies to designate the similar goods to be displayed through replacement of the original component by a similar component, for example, replacement of a component having an aperture by a component having no aperture, the components each having the same size.

Next, the program goes to a step c2 in which the "confidentiality control" is performed. In the "confidentiality control", there is performed a set up of limiting data to be outputted, for the purpose of keeping secret, in accordance with an operation of an operator. As the attributes to be set up here, there exist "validity", "invalidity", and "structure information". The "validity" implies that data of the component of interest is permissible to be outputted. The "invalidity" implies that data of the component of interest is prohibited from being outputted. The "structure information" implies that while the detailed data for the component of interest is prohibited from being outputted, it is permitted to output data in such a degree that it is understood that a component exists at a position of the component of the assembly.

Next, the program goes to a step c3 in which the "information control" is performed. In the "information control", with respect to assembling of the assembly, there is performed a set up to confirm the present situation. As the attributes to be set up here, there exist "progress situation" for a creation of components constituting the assembly, "error" such as a matter that no component exists, and a matter that components are overlapped, and "alarm" generated when a set up operation for an attribute, which is prohibited in set up, is performed.

In step c4, the attributes set up in the step c1 to step c3 are reflected on the assembly structure, and the attribute correction data is created.

As explained referring to FIGS. 11 and 12, the operation of the attribute set up is performed in such a manner that upon receipt of CAD data from the CAD system, the CAD data is separated into the structure data, the position data and the geometry data. Accordingly, to set up attributes, it is effective that only the structure data or the position data is read, and the geometry data is not read. This feature makes it possible to remarkably reduce a time required for the attribute set up, and thereby extremely efficiently performing the design work using the CAD system.

While the above-mentioned embodiments are the examples in which the CAD system and the CAD supporting system are constructed in the same computer system, it is acceptable that the CAD system and the CAD supporting system are implemented in mutually different computer systems which are connected via for example a communication line.

As mentioned above, according to the present invention, it is possible to support the design utilizing the CAD, and efficiently perform the design work.

Although the present invention has been described with reference to the particular illustrative embodiments, it is not to be limited to those embodiments but only by the appended claims. It is to be appreciated that those skilled in the art can change or modify the embodiments without departing from the scope and sprit of the present invention.

What is claimed is:

1. A CAD supporting apparatus supporting a CAD assembling of an assembly constituted of a plurality of components creating a geometry of objects, said CAD supporting apparatus comprising:

a data separating section separating the CAD data into structure data representing a structure of the assembly, geometry data representing a geometry of the components constituting the assembly, and position data representing a position of the components on the assembly, upon receipt of the CAD data from the CAD;

an attribute set up section far setting up an attribute onto the separated data; and a CAD data reconstruction section recreating CAD data representing an assembly from the separated data reflecting the set attribute, and transmitting the recreated CAD data to the CAD.

2. The CAD supporting apparatus according to claim 1, wherein said attribute set up section sets up at least a display attribute representing a display or a non-display of the components, a confidentiality attribute representing a permission or a prohibition of the components data output, and an information attribute representing a development progress of the components.

3. The CAD supporting apparatus according to claim 1, wherein said CAD data reconstruction section recreates the structure data and the position data into a CAD data format compatible with another CAD.

4. The CAD supporting apparatus according to claim 1, wherein said attribute set up section sets up a confidentiality attribute representing a permission or a prohibition of the components data output, and said CAD data reconstruction section recreates the CAD data with the prohibited components deleted.

5. A CAD supporting apparatus supporting a CAD assembling an assembly constituted of a plurality of components creating a geometry of objects, said CAD supporting apparatus comprising:

a text data obtaining section obtaining text data describing a structure of the assembly; and a CAD creating section interpreting the obtained text data, and referring to a database that stores geometry data of components to create CAD data according to the text data.

6. A machine readable storage storing at least one program controlling a CAD supporting computer according to a process comprising:

separating CAD data of an assembly, which is constituted of a plurality of components creating a geometry of objects, into structure data representing a structure of the assembly, geometry data representing a geometry of the components constituting the assembly, and position data representing a position of the components on the assembly;

setting up an attribute on the separated data reconstructing CAD data representing an assembly from the separated data reflecting the set attribute; and transmitting the reconstructed CAD data to the CAD.

7. The storage according to claim 6, wherein said attribute setting sets up at least a display attribute representing a display or a non-display of the components, a confidentiality attribute representing a permission or a prohibition of the components data output, and an information attribute representing a development progress of the components.

8. The storage according to claim 6, wherein the reconstructing comprises converting the structure data, the geometry data, and the position data into a CAD data format compatible with another CAD.

9. The storage according to claim 6, wherein said attribute setting sets up a confidentiality attribute representing a permission or a prohibition of the components data output, and the reconstructing reconstructs the CAD with the prohibited components deleted.

10. A machine readable storage storing at least one program controlling a CAD supporting computer according to a process comprising:

obtaining text data describing a structure of a CAD assembly; and interpreting the obtained text data, and referring to a database that stores geometry data representing a geometry of components to create CAD data according to the text data.

* * * * *

UNITED STATES PATENT AND TRADEMARK OFFICE
CERTIFICATE OF CORRECTION

PATENT NO.     : 6,636,774 B2                                            Page 1 of 1
DATED          : October 21, 2003
INVENTOR(S)    : Tsukasa Tenma et al.

It is certified that error appears in the above-identified patent and that said Letters Patent is hereby corrected as shown below:

<u>Column 13,</u>
Line 11, after "section", delete "far".

<u>Column 14,</u>
Line 15, after "separated data", insert -- ; --.

Signed and Sealed this

Twenty-third Day of December, 2003

JAMES E. ROGAN
*Director of the United States Patent and Trademark Office*